United States Patent
McDonald et al.

(10) Patent No.: US 7,120,176 B2
(45) Date of Patent: Oct. 10, 2006

(54) WAVELENGTH REFERENCE APPARATUS AND METHOD

(75) Inventors: Mark McDonald, Milpitas, CA (US); Mark Rice, San Jose, CA (US); Andrew Daiber, Palo Alto, PA (US); William B. Chapman, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 373 days.

(21) Appl. No.: 10/173,514

(22) Filed: Jun. 15, 2002

(65) Prior Publication Data

US 2003/0016707 A1     Jan. 23, 2003

Related U.S. Application Data

(63) Continuation-in-part of application No. 10/099,649, filed on Mar. 15, 2002, now Pat. No. 6,853,654, which is a continuation-in-part of application No. 09/626,526, filed on Jul. 27, 2000, now Pat. No. 6,879,619.

(60) Provisional application No. 60/276,645, filed on Mar. 16, 2001, provisional application No. 60/276,813, filed on Mar. 16, 2001, provisional application No. 60/276,643, filed on Mar. 16, 2001, provisional application No. 60/276,760, filed on Mar. 16, 2001, provisional application No. 60/276,646, filed on Mar. 16, 2001.

(51) Int. Cl.
*H01S 3/13*     (2006.01)

(52) U.S. Cl. .............................. 372/29.02; 372/29.01; 372/29.011

(58) Field of Classification Search .................. 372/20, 372/29.011, 99, 102, 105, 29.02, 29.01
See application file for complete search history.

(56) References Cited

U.S. PATENT DOCUMENTS

| | | | |
|---|---|---|---|
| 3,788,743 | A | 1/1974 | George |
| 3,899,748 | A | 8/1975 | Bodlaj |
| 3,921,099 | A | 11/1975 | Abrams et al. |
| 3,965,440 | A | 6/1976 | Graves |
| 3,967,211 | A | 6/1976 | Itzkan et al. |
| 4,309,671 | A | 1/1982 | Malyon |
| 4,410,992 | A | 10/1983 | Javan |

(Continued)

FOREIGN PATENT DOCUMENTS

EP     0924628 A2     6/1999

(Continued)

OTHER PUBLICATIONS

PCT International Search Report, Mar. 15, 2002.

(Continued)

*Primary Examiner*—Armando Rodriguez
(74) *Attorney, Agent, or Firm*—Blakely, Sokoloff, Taylor & Zafman LLP

(57) ABSTRACT

Apparatus and methods usable for wavelength references and measurement of wavelength of a light beam. The apparatus comprise at least two wavelength reference or filter elements positioned in a light beam, each wavelength reference element having a different free spectral range and operable to define a joint free spectral range, and a detector positioned in the beam after the wavelength reference elements. The joint free spectral range provided by the multiple wavelength reference elements results in a joint transmission peak that is centered at a unique wavelength, and maximum optical power detectable from the beam by the detector occurs at the center wavelength of the joint transmission peak.

25 Claims, 11 Drawing Sheets

U.S. PATENT DOCUMENTS

| | | | |
|---|---|---|---|
| 4,460,977 A | 7/1984 | Shimada et al. | |
| 4,504,950 A | 3/1985 | AuYeung | |
| 4,560,246 A | 12/1985 | Cotter | |
| 4,583,227 A | 4/1986 | Kirkby | |
| 4,730,105 A | 3/1988 | Mitschke et al. | |
| 4,770,047 A | 9/1988 | Arditty et al. | |
| 4,839,614 A | 6/1989 | Hill et al. | |
| 4,843,233 A | 6/1989 | Jeunhomme | |
| 4,847,854 A | 7/1989 | Van Dijk | |
| 4,870,269 A | 9/1989 | Jeunhomme et al. | |
| 4,932,782 A | 6/1990 | Graindorge et al. | |
| 4,934,816 A | 6/1990 | Silver et al. | |
| 4,947,398 A * | 8/1990 | Yasuda et al. | 372/29.021 |
| 4,994,677 A | 2/1991 | Graindorge | |
| 5,022,745 A | 6/1991 | Zayhowski et al. | |
| 5,028,395 A | 7/1991 | Sebille et al. | |
| 5,050,179 A | 9/1991 | Mooradian | |
| 5,058,124 A | 10/1991 | Cameron et al. | |
| 5,103,457 A | 4/1992 | Wallace et al. | |
| 5,115,677 A | 5/1992 | Martin et al. | |
| 5,124,993 A | 6/1992 | Braunlich et al. | |
| 5,130,998 A * | 7/1992 | Wakata et al. | 372/32 |
| 5,141,316 A | 8/1992 | Lefevre et al. | |
| 5,163,063 A | 11/1992 | Yoshikawa et al. | |
| 5,172,185 A | 12/1992 | Leuchs et al. | |
| 5,181,078 A | 1/1993 | Lefevre et al. | |
| 5,181,214 A | 1/1993 | Berger et al. | |
| 5,185,643 A | 2/1993 | Vry et al. | |
| 5,214,659 A | 5/1993 | Terada et al. | |
| 5,218,610 A | 6/1993 | Dixon | |
| 5,225,930 A | 7/1993 | Land et al. | |
| 5,245,626 A | 9/1993 | Burke et al. | |
| 5,251,222 A | 10/1993 | Hester et al. | |
| 5,263,037 A | 11/1993 | Trutna, Jr. et al. | |
| 5,270,791 A | 12/1993 | Lefevre et al. | |
| 5,289,491 A | 2/1994 | Dixon | |
| 5,305,330 A | 4/1994 | Rieder et al. | |
| 5,319,668 A | 6/1994 | Luecke | |
| 5,321,717 A | 6/1994 | Adachi et al. | |
| 5,327,447 A | 7/1994 | Mooradian | |
| 5,331,651 A | 7/1994 | Becker et al. | |
| 5,347,527 A | 9/1994 | Favre et al. | |
| 5,349,439 A | 9/1994 | Graindorge et al. | |
| 5,349,440 A | 9/1994 | DeGroot | |
| 5,373,515 A | 12/1994 | Wakabayashi et al. | |
| 5,387,974 A | 2/1995 | Nakatani | |
| 5,412,474 A | 5/1995 | Reasenberg et al. | |
| 5,412,676 A | 5/1995 | Schnier et al. | |
| 5,414,280 A | 5/1995 | Girmay | |
| 5,418,800 A | 5/1995 | Prior et al. | |
| 5,420,687 A | 5/1995 | Kachanov | |
| 5,428,700 A | 6/1995 | Hall | |
| 5,438,579 A | 8/1995 | Eda et al. | |
| 5,444,724 A | 8/1995 | Goto | |
| 5,450,202 A | 9/1995 | Tisue | |
| 5,473,625 A | 12/1995 | Hansen et al. | |
| 5,543,916 A | 8/1996 | Kachanov | |
| 5,583,638 A | 12/1996 | Cutler | |
| 5,594,744 A | 1/1997 | Lefevre et al. | |
| 5,606,439 A | 2/1997 | Wu | |
| 5,631,736 A | 5/1997 | Thiel et al. | |
| 5,651,018 A | 7/1997 | Mehuys et al. | |
| 5,673,129 A | 9/1997 | Mizrahi | |
| 5,712,704 A | 1/1998 | Martin et al. | |
| 5,719,674 A | 2/1998 | Martin et al. | |
| 5,737,109 A | 4/1998 | Goodwin | |
| 5,751,750 A | 5/1998 | Friede et al. | |
| 5,760,391 A | 6/1998 | Narendran | |
| 5,777,773 A | 7/1998 | Epworth et al. | |
| 5,802,085 A | 9/1998 | Lefevre et al. | |
| 5,812,716 A | 9/1998 | Ohishi | |
| 5,825,792 A | 10/1998 | Villeneuve et al. | |
| 5,848,092 A | 12/1998 | Mitsumoto et al. | |
| 5,862,162 A | 1/1999 | Maeda | |
| 5,872,881 A | 2/1999 | Rossi et al. | |
| 5,886,785 A | 3/1999 | Lefevre et al. | |
| 5,917,188 A | 6/1999 | Atkinson et al. | |
| 5,943,352 A | 8/1999 | Fee | |
| 5,946,331 A | 8/1999 | Amersfoort et al. | |
| 5,991,061 A | 11/1999 | Adams et al. | |
| 6,018,535 A | 1/2000 | Maeda | |
| 6,018,536 A * | 1/2000 | Alphonse | 372/23 |
| 6,026,100 A | 2/2000 | Maeda | |
| 6,034,799 A | 3/2000 | Hansen | |
| 6,040,950 A | 3/2000 | Broome | |
| 6,043,883 A | 3/2000 | Leckel et al. | |
| 6,044,095 A | 3/2000 | Asano et al. | |
| 6,061,369 A | 5/2000 | Conradi | |
| 6,064,501 A | 5/2000 | Roberts et al. | |
| 6,081,539 A | 6/2000 | Mattori et al. | |
| 6,084,695 A | 7/2000 | Martin et al. | |
| 6,108,355 A | 8/2000 | Zorabedian | |
| 6,115,121 A | 9/2000 | Erskine | |
| 6,115,401 A | 9/2000 | Scobey et al. | |
| 6,141,370 A | 10/2000 | Avrutsky et al. | |
| 6,151,337 A | 11/2000 | Carlsten et al. | |
| 6,181,717 B1 | 1/2001 | Kner et al. | |
| RE37,044 E | 2/2001 | Wu | |
| 6,192,058 B1 | 2/2001 | Abeles | |
| 6,201,638 B1 | 3/2001 | Hall et al. | |
| 6,205,159 B1 * | 3/2001 | Sesko et al. | 372/20 |
| 6,215,802 B1 | 4/2001 | Lunt | |
| 6,229,835 B1 | 5/2001 | Tomaru et al. | |
| 6,243,517 B1 | 6/2001 | Deacon | |
| 6,246,480 B1 | 6/2001 | O'Brien | |
| 6,249,364 B1 | 6/2001 | Martin et al. | |
| 6,249,365 B1 | 6/2001 | Mizrahi et al. | |
| 6,252,718 B1 | 6/2001 | Lefevre | |
| 6,259,712 B1 | 7/2001 | DeCain et al. | |
| 6,263,004 B1 | 7/2001 | Arvidsson et al. | |
| 6,282,215 B1 | 8/2001 | Zorabedian et al. | |
| 6,301,274 B1 | 10/2001 | Tayebati et al. | |
| 6,301,280 B1 | 10/2001 | Broutin et al. | |
| 6,304,586 B1 | 10/2001 | Pease et al. | |
| 6,314,115 B1 | 11/2001 | Delfyett et al. | |
| 6,321,011 B1 | 11/2001 | Deacon | |
| 6,324,204 B1 | 11/2001 | Deacon | |
| 6,330,253 B1 | 12/2001 | Tuganov et al. | |
| 6,331,892 B1 | 12/2001 | Green | |
| 6,337,660 B1 | 1/2002 | Esman et al. | |
| 6,366,592 B1 | 4/2002 | Flanders | |
| 6,366,689 B1 | 4/2002 | Rao et al. | |
| 6,404,538 B1 | 6/2002 | Chen et al. | |
| 6,441,933 B1 | 8/2002 | Jang | |
| 6,463,085 B1 | 10/2002 | Tayebati | |
| 6,470,036 B1 | 10/2002 | Bailey et al. | |
| 6,526,071 B1 * | 2/2003 | Zorabedian et al. | 372/20 |
| 6,532,091 B1 | 3/2003 | Miyazaki et al. | |
| 6,600,760 B1 | 7/2003 | Green et al. | |
| 2002/0048297 A1 | 4/2002 | Irie et al. | |
| 2002/0054614 A1 | 5/2002 | Jin | |
| 2002/0126345 A1 | 9/2002 | Green et al. | |
| 2002/0126386 A1 * | 9/2002 | Jordan et al. | 359/577 |
| 2002/0136104 A1 | 9/2002 | Daiber | |

FOREIGN PATENT DOCUMENTS

| | | |
|---|---|---|
| WO | WO 98/05105 | 2/1998 |
| WO | WO 98/44424 | 10/1998 |
| WO | WO 00/49689 | 8/2000 |
| WO | WO 01/04999 A1 | 1/2001 |
| WO | WO 02/078137 A1 | 10/2002 |
| WO | WO 03/005500 A2 | 1/2003 |
| WO | WO 03/005501 A2 | 1/2003 |

| | | |
|---|---|---|
| WO | WO 03/005512 A2 | 1/2003 |
| WO | 02/07672 | 3/2003 |

OTHER PUBLICATIONS

Ketelsen, L. J. P., "Simple Technique for Measuring Cavity Loss in Semiconductor Lasers," *Electronics Letters*, (Aug. 18, 1994), vol. 30, No. 17, pp. 1422-1424.

Shtengel, G. E., et al., "Internal Optical Loss Measurements in 1.3μm InGaAsP Lasers," *Electronic Letters*, (Jul. 6, 1995), vol. 31, No. 14, pp. 1157-1159.

Boggs, B. et al., "Simple High-Coherence Rapidly Tunable External-Cavity Diode Laser," *Optics Letters*, vol. 23, No. 24, Dec. 15, 1998, pp. 1906-1908.

Rosenberg, K. P. et al., "Logarithmically Variable Infrared Etalon Filters," *SPIE*, vol. 2262, pp. 223-232.

Scobey, M. and Stupik, P., "Stable Ultra-Narrow Bandpass Filters," *SPIE*, vol. 2262, pp. 37-46.

Takahashi, H., "Temperature Stability of Thin-Film Narrow-Bandpass Filters Produced by Ion-Assisted Deposition," *Applied Optics*, vol. 34, No. 4, Feb. 1, 1995, pp. 667-675.

Favre, F. et al., "External-Cavity Semiconductor Laser With 15nm Continuous Tuning Range," *Electronics Letters*, vol. 22, No. 15, Jul. 19, 1986, pp. 795-796.

Macleod, H.A., "Thin Film Optical Filters," 2nd Edition, McGraw-HIll, 1989, pp. 244-269.

Mellis, J. et al., "Miniature Packaged External-Cavity Semiconductor Laser with 50GHz Continuous Electrical Tuning Range," *Electronics Letters*, vol. 24, No. 16, Apr. 22, 1988, pp. 988-989.

* cited by examiner

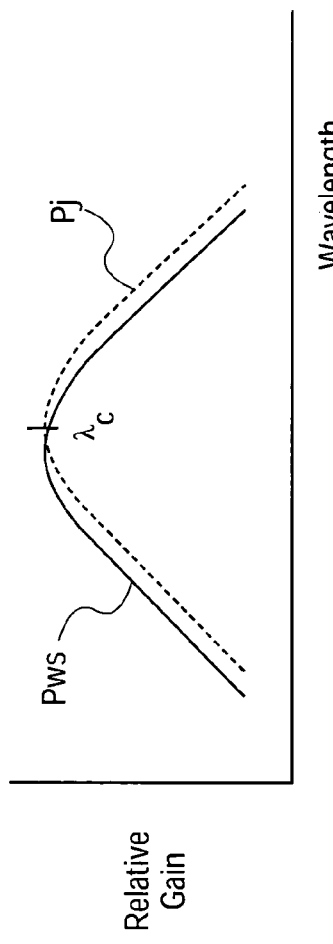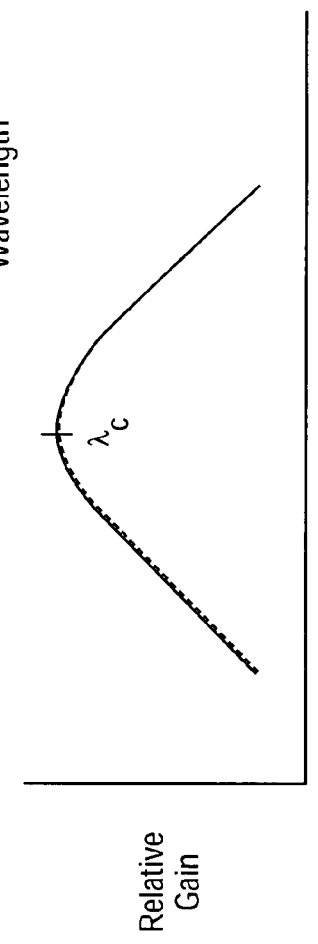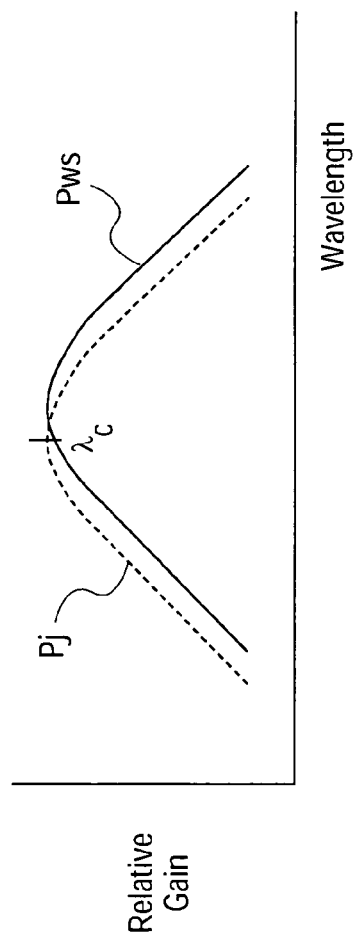
FIG. 7A
FIG. 7B
FIG. 7C

WAVELENGTH REFERENCE APPARATUS AND METHOD

This application is a continuation-in-part of U.S. patent application Ser. No. 09/626,526, filed Jul. 27, 2000 now U.S. Pat. No. 6,879,619 and a CIP U.S. patent application Ser. No. 10/099,649, filed Mar. 15, 2002 now U.S. Pat. No. 6,853,654; and is entitled to the benefits of U.S. Provisional Application No. 60/276,645, filed Mar. 16, 2001, U.S. Provisional Application No. 60/276,813, Mar. 16, 2001, U.S. Provisional Application Ser. No. 60/276,643, filed Mar. 16, 2001, U.S. Provisional Application No. 60/276,760, filed Mar. 16, 2001 and U.S. Provisional Application Ser. No. 60/276,646, filed Mar. 16, 2001, the disclosures of which are incorporated herein by reference.

BACKGROUND OF THE INVENTION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining a wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve. Effective operation of tunable lasers requires reliable wavelength reference systems for determining wavelength of laser output. Available wavelength reference systems used in external cavity lasers and other optical systems are subject to change due to aging and related changes in optical components during use, and can be unreliable. There is a need for wavelength reference apparatus methods that provide easy and accurate wavelength determination and which are reliable and not susceptible to variation due to aging during use. The present invention satisfies these needs, as well as others, and overcomes the deficiencies found in the background art.

SUMMARY

The invention provides apparatus and methods for wavelength references and wavelength monitoring in optical systems. The apparatus of the invention comprises at least two wavelength reference or filter elements positioned in a light beam, each wavelength reference element having a different free spectral range and operable to define a joint free spectral range, and a detector positioned in the beam after the wavelength selection elements that is operable to measure or monitor the optical power level of the beam. The joint free spectral range provided by the multiple wavelength reference elements results in a joint transmission peak that is centered at a unique wavelength, and maximum optical power detectable from the beam by the detector occurs at the center wavelength of the joint transmission peak. The joint transmission peak thus provides a usable wavelength reference according to the combined free spectral ranges of the wavelength reference elements.

More specifically, the apparatus may comprise a first wavelength reference element positioned in a light beam and having a first free spectral range, a second wavelength reference element positioned in the light beam and having a second free spectral range, with the first and second wavelength reference elements configured to define a joint free spectral range and provide a joint transmission peak of unique wavelength, and a detector, positioned in the light beam after the first and second wavelength reference elements, that is operable to measure optical power of the light beam. In certain embodiments, the apparatus may comprise a third, fourth or additional wavelength reference element positioned in the beam, with each such additional wavelength reference element having a different free spectral range and being operable to contribute to the joint free spectral range and joint transmission peak of unique wavelength. The light beam may comprise a test or sample beam of light that is split or picked off from a light beam of interest for wavelength measurement or testing. In this regard, the invention may additionally comprise a beam splitter positioned in the beam of interest to form a sample or test beam wherein the wavelength reference elements and detector are positioned.

The apparatus of the invention may be embodied in a laser apparatus comprising a gain medium emitting a light beam, a first wavelength reference element with a first free spectral range positioned in the light beam, a second wavelength reference element with a second free spectral range positioned in the light beam, and a detector positioned in the light beam after the first and second wavelength reference elements. In other embodiments, the laser apparatus may comprise a gain medium emitting a light beam, a beam splitter positioned in association with the light beam and configured to split or pick off a portion of the light beam as a sample or test beam, a first wavelength reference element with a first free spectral range positioned in the test beam, a second wavelength reference element with a second free spectral range positioned in the test beam, and a detector, positioned in the test beam after the first and second wavelength reference elements, that is operable to measure optical power of the test beam. The first and second free spectral ranges differ by a known or fixed amount or offset such that the two free spectral ranges together define a joint free spectral range and provide a joint transmission peak of unique wavelength.

In certain embodiments, the laser apparatus may be in the form of an external cavity laser apparatus comprising a gain medium emitting a light beam or beams, one or more reflective elements positioned in the in association with a light beam emitted by the gain medium to define an external laser cavity, at least two wavelength reference elements positioned in a light beam emitted by the gain medium, and a detector positioned in the light beam after the wavelength reference elements. A wavelength selection element or other feedback mechanism may be included in association with the external laser cavity to provide feedback to the gain medium at a selected wavelength. A beam splitter may be included with the apparatus and positioned to pick or split off a portion of a light beam emitted by the gain medium as a sample beam, and to direct the sample beam through two or more wavelength reference elements to a detector. The wavelength reference elements have different free spectral ranges and operate to create a joint transmission peak at a unique reference wavelength.

By way of example, and not of limitation, the wavelength reference elements may comprise etalon, interference filter, grating, prism or other wavelength devices that are capable of providing wavelength references that operate to provide a joint free spectral range with a joint transmission peak of unique wavelength in accordance with the invention. Various combinations of etalons, interference filters, gratings and prisms may be used. The gain medium may comprise a laser diode emitter, a flash lamp pumped laser dye gain medium or crystal gain medium, a gas medium that is pumped electrically, or other form of gain medium.

The gain medium may comprise first and second facets from which are emitted the first and second beams. An antireflection coating may be included on the first facet and a partially reflective coating included on the second facet such that the second facet and an external reflective element define the laser external cavity. The second beam may comprise an output beam from which a sample beam is split or picked off and directed through two or more wavelength reference elements to a detector in accordance with the invention. In certain embodiments, the laser apparatus of the invention may comprise a control element operatively coupled to the wavelength selection element and the detector that is operable to adjust or tune the wavelength selection element according to optical power levels determined by the detector.

The methods of the invention comprise, in general terms, positioning at least two wavelength reference elements of different free spectral range in a test light beam, positioning a detector in the light beam after the etalons, and measuring optical power of the light beam. The methods further comprise generating a joint transmission peak by the two or more wavelength reference elements in the test beam. The methods may further comprise splitting or picking off a portion of a light beam of interest to create the test light beam. The methods may additionally comprise emitting of the light beam by a gain medium. In certain embodiment the methods may also comprise adjusting the wavelength of the light beam of interest according to optical power measured by the detector. The methods, in some embodiments, may additionally comprise generating error signals according to detected optical power, and adjusting wavelength of the light beam of interest according to the error signals.

The invention also provides methods of laser operation which comprise emitting a light beam by a gain medium, picking or splitting off a portion of the light beam to form a test beam, positioning first and second wavelength reference elements, having respectively first and second different free spectral ranges, in the test beam, positioning a detector in the test beam after the wavelength reference elements, and measuring optical power of the test beam. In certain embodiments, the method of laser operation may comprise emitting a first light beam from a first facet of a gain medium, emitting a second light beam from a second facet of the gain medium, positioning a wavelength selection element in the first light beam, feeding back light of a selected wavelength to the gain medium from the wavelength selection element, picking or splitting off a portion of the light beam to form a test beam, positioning at least two wavelength reference elements of different free spectral range in the test light beam, positioning a detector in the test beam after the wavelength reference elements, and measuring optical power of the light beam.

BRIEF DESCRIPTION OF THE DRAWINGS

The invention will be more fully understood by reference to the following drawings, which are for illustrative purposes only.

FIGS. 7A–7C are graphical illustrations of the alignment of a transmission peak of a wavelength selection element with the reference wavelength defined by the joint transmission peak of the etalon pair wavelength reference of FIG. 6.

DETAILED DESCRIPTION OF THE INVENTION

Figure 1:
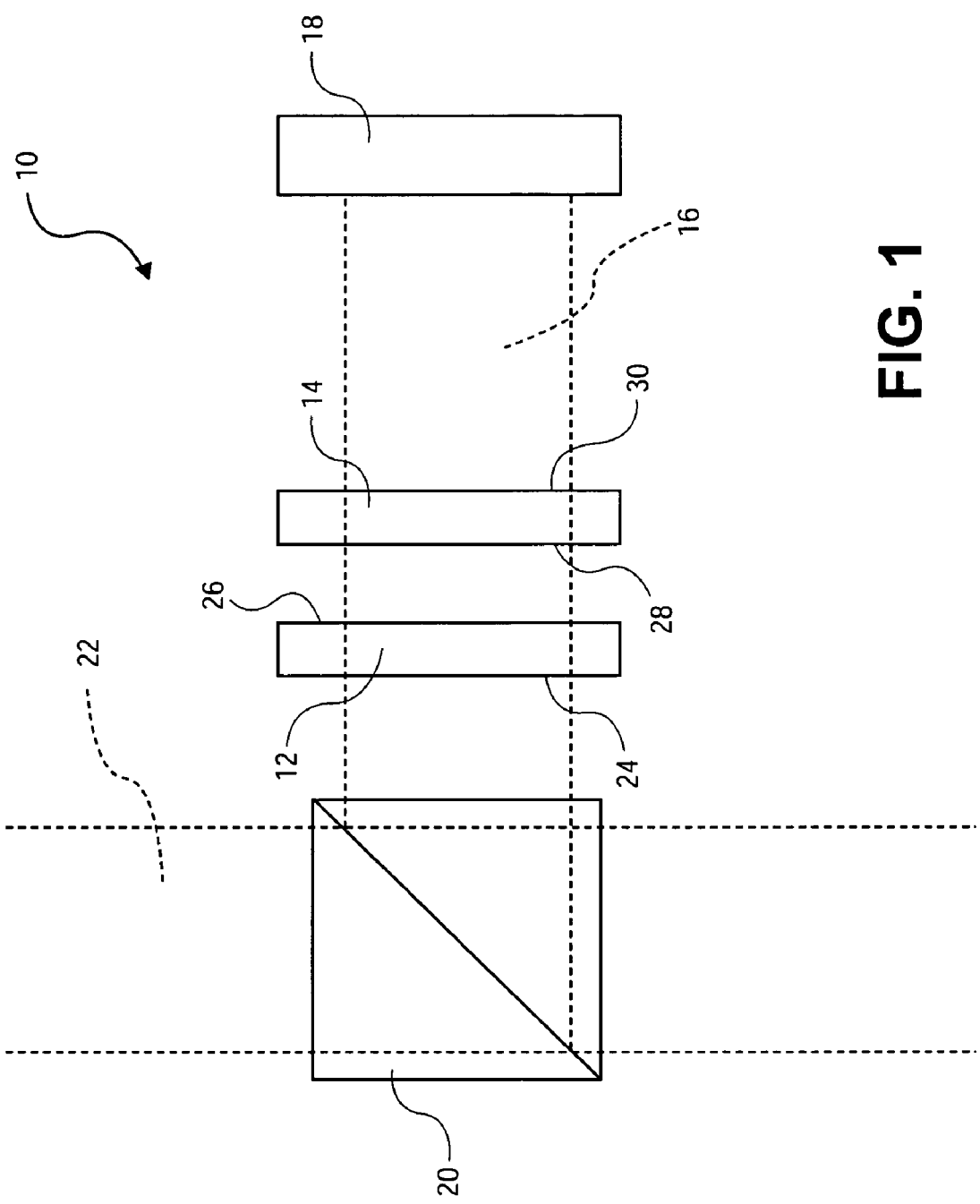
FIG. 1 is schematic diagram of a wavelength reference apparatus in accordance with the invention.

Referring more specifically to the drawings, for illustrative purposes the present invention is embodied in the apparatus shown in FIG. 1 through FIG. 10. It will be appreciated that the apparatus may vary as to configuration and as to details of the parts, and that the method may vary as to details and the order of the acts, without departing from the basic concepts as disclosed herein. The invention is disclosed primarily in terms of use with an external cavity laser. The invention, however, may be used with various types of laser devices and optical systems. The relative sizes of components and distances therebetween as shown in the drawings are in many instances exaggerated for reason of clarity, and should not be considered limiting. Any definitions herein are provided for reason of clarity, and should not be considered as limiting, and any technical and scientific terms used herein are intended to have the same meaning as commonly understood by those skilled in the art. It should also be understood that the terminology used herein is for the purpose of describing particular embodiments only, and is not intended to be limiting, since the scope of the present invention will be limited only by the appended claims.

Referring now to FIG. 1, a wavelength reference apparatus 10 in accordance with the invention is shown. The apparatus 10 includes first and second wavelength reference elements that are shown for exemplary purposes as first and second etalons 12, 14, which are positioned in a light beam 16. A photodetector 18 is positioned in light beam 16 after etalons 12, 14. Light beam 16 may comprise a test beam that is split or picked off from another light beam 20 by a beam splitter 22 positioned in light beam 20 and configured to direct test beam 16 towards etalons 12, 14 and detector 18. Light beam 20 may comprise, for example, the output beam of a tunable laser, a beam that is reflected off or transmitted through an optical component, or other light beam of interest for which wavelength characterization is desired. Photodetector 18 may comprise a photodiode device or other form of optical power detector.

First etalon 12 includes faces 24, 26, and acts as a Fabry-Perot interference filter with a first free spectral range $FSR_1$ according to the spacing between faces 24, 26 and the refractive index of the material of etalon 12. Second etalon 14 includes faces 28, 30, and acts as a Fabry-Perot interference filter with a second free spectral range $FSR_2$ defined by the spacing between faces 28, 30 and the refractive index of the material of etalon 14. Etalons 12, 14 may comprise parallel plate solid, liquid or gas spaced etalons. Etalons 12, 14 may comprise different materials with different refractive indices, and may have different dimensions to provide selected free spectral ranges $FSR_1$, $FSR_2$.

Figure 2A:
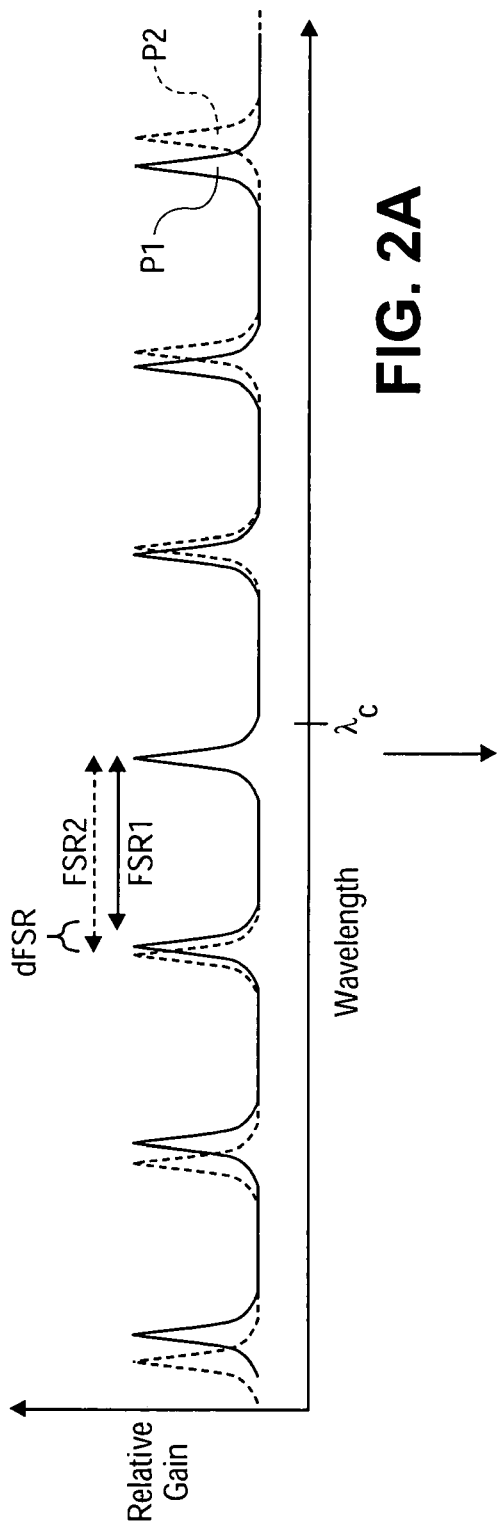
FIG. 2A is a graphical representation of the transmission peaks defined by the etalons of the apparatus of FIG. 1.
Figure 2B:
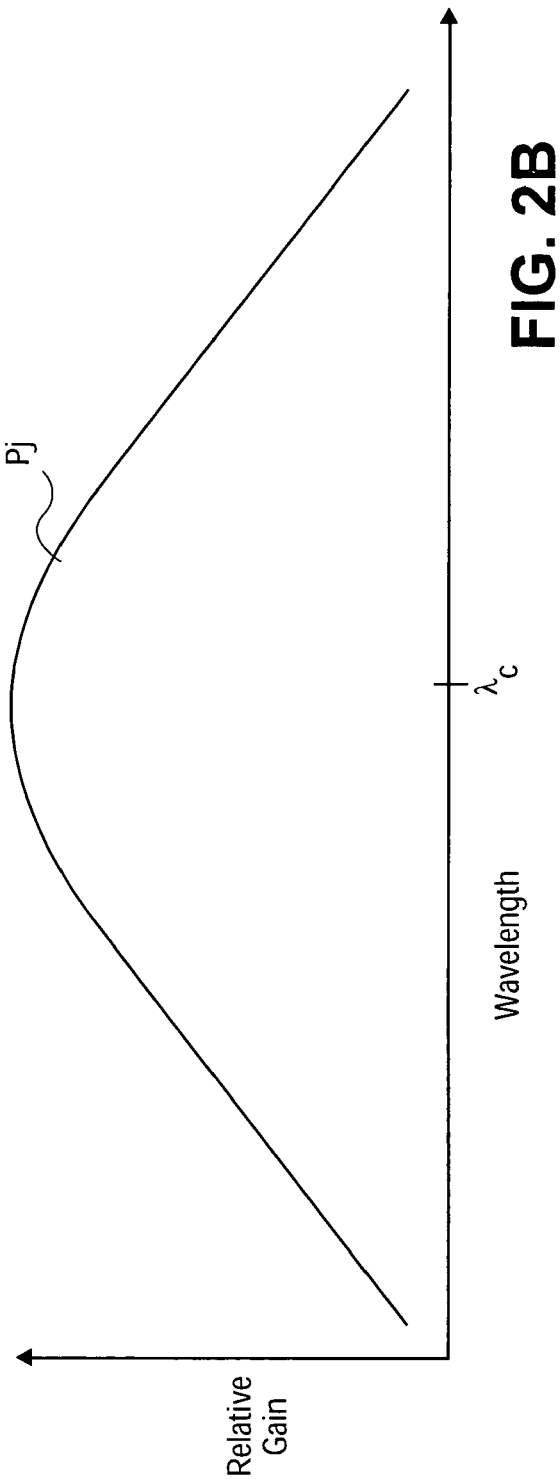
FIG. 2B is a graphical representation of the joint transmission peak resultant from the transmission peaks defined by the etalons of the apparatus of FIG. 1.

Referring also to FIG. 2A, first etalon 12 is structured and configured to define a first set or plurality of pass bands, modes or transmission peaks $P_1$ (shown in solid line), the maxima of which are separated by a distance equal to $FSR_1$. Second etalon 14 similarly defines a second set or plurality of pass bands, modes or transmission peaks $P_2$ (shown as a dashed line), with the transmission maxima of peaks $P_2$ separated by a distance equal to $FSR_2$. First and second etalons 24, 26 are structured and configured in many embodiments such that $FSR_1$ and $FSR_2$ are of similar magnitude, but are unequal, i.e., $FSR_1 \neq FSR_2$.

The difference between $FSR_1$ and $FSR_2$, or the magnitude of $\delta FSR$, may be varied according to the particular reference wavelength desired. In many embodiments, etalons 12, 14 are structured and configured such that $FSR_1$ will be generally within a few percent of $FSR_2$. Thus, for example, $FSR_1$ may be equal to between approximately 99% and 101% of $FSR_2$ in some embodiments, while in other embodiments $FSR_1$ may be equal to between approximately 98% and 102% of $FSR_2$. In certain embodiments, the difference between the free spectral ranges of etalons 24, 26 may be greater, such that $FSR_1$ is equal to between approximately 95% and 105% of $FSR_2$, and some cases, $FSR_1$ may be equal to between approximately 90% and 110% of $FSR_2$ or more.

The difference in the free spectral range, $\delta FSR$, of the two etalons 12, 14 is such that certain or selected peaks $P_1$ and $P_2$ of the two sets of transmission peaks will overlap or align, while the remainder of peaks $P_1$ and $P_2$ are non-overlapping or mis-aligned with respect to each other. In FIG. 2A, a point of overlap or alignment of peaks $P_1$ and $P_2$ is shown at wavelength $_c$. Additional overlap points for peaks $P_1$ and $P_2$ occur outside the wavelength range shown in FIG. 2A. The overlap of peaks $P_1$ and $P_2$ defines or otherwise results in joint transmission peaks $P_j$, shown in FIG. 2B, from the two etalons 12, 14. The joint transmission peaks $P_j$ are separated in wavelength by a joint free spectral range or $FSR_j$. Only one joint transmission peak, with a center wavelength or maximum transmission wavelength $_c$ is shown within the wavelength range of FIG. 2B.

The difference in free spectral range between $FSR_1$ and $FSR_2$ may be achieved by providing a difference in optical path length (including dispersion effects) for each of the etalons 12, 14. Structuring or configuring the etalons 12, 14 to provide different free spectral range can be achieved by various approaches. For example, a small net difference in free spectral range for two etalons may be obtained from a single parallel substrate that, after machining and polishing to attain a desired thickness, is subdivided. One half of the substrate is then subject to an additional operation wherein material is extracted by grinding, polishing or etching to reduce thickness, or wherein an additional substrate material layer or layers are added via conventional material deposition technique to increase thickness. The two halves of the original substrate will thus provide two etalons of slightly differing optical path length and different free spectral ranges. It should be noted that, for two etalons of the same material and the same nominal thickness, a small difference in free spectral range is also realizable by temperature difference or an angle difference between the two etalons, or other difference in tuning effect applied to the etalons. Other procedures for preparation of etalons of desired free spectral range may also be used and will suggest themselves to those skilled in the art.

In some embodiments of the invention one or both of etalons 12, 14 may be tunable by adjustment of etalon optical path length to adjust $FSR_1$ and/or $FSR_2$, which in turn provides adjustment of $FSR_j$ and the center wavelength $_c$ of the joint transmission peak $P_j$. Such adjustment may be achieved using various techniques including thermo-optic, electro-optic, acousto-optic and piezo-optic tuning to vary refractive index, mechanical angle tuning and/or thermal tuning to vary the spacing of etalon faces, or other mechanism. More than one such tuning effect may be applied simultaneously to one or both etalons 12, 14, depending upon the particular embodiment of the invention. The tuning of etalons to adjust $FSR_1$ and/or $FSR_2$ is described further below.

The center wavelength $_c$ of the joint transmission peak $P_j$ wavelength $_c$ occurs at the transmission maximum of joint transmission peak $P_j$, and is usable as a wavelength reference for characterizing or determining the wavelength of test beam 16, and hence the beam of interest 22 from which test beam 16 is derived. The spectral curvature or shape of joint transmission peak $P_j$ is such that maximum transmission of beam 16 through etalons 12, 14, which is detectable as a maximum power observed by detector 18, occurs at the center or reference wavelength $_c$. Thus, when test beam 16 is transmitted through etalons 12, 14 with highest efficiency and a maximum in optical power is detected, the wavelength of test beam 16 (and hence beam 22) is at the reference wavelength. Transmission at other wavelengths will result in lower optical power levels received by detector 18, with the level of optical power reaching detector 18 decreasing as the wavelength of beam 16 moves away from wavelength $_c$.

The joint free spectral range $FSR_j$ can be configured, according to the configuration of etalons 12, 14, such that there is only a single joint transmission peak $P_j$ within a particular wavelength range of interest. As such, the transmission maximum of joint transmission peak $P_j$ provides a unique wavelength reference within the wavelength range of interest. Such a wavelength range may comprise, for example, the gain bandwidth of a tunable laser, the wavelength range encompassed by a transmission channel grid, or other wavelength range of interest. A modulation or dither can be introduced into the joint transmission peak $P_j$ to provide a facile route for generation of error signals for wavelength control, and is described further below.

The unique reference wavelength within a selected wavelength range as provided by the use of multiple etalons allows a unique wavelength identification to be made for test beam 16 and beam 22. Prior art wavelength references have largely been based on use of a single etalon, through which a first portion of a light beam directed through the single etalon to a first photodetector, and a second portion of the light beam passing directly to a second photodetector. Single etalon wavelength "lockers" of this sort are degenerate in etalon mode number. A light beam passing through the etalon may have departed from the grid defined by the single etalon but, since multiple transmission maxima will generally exist within the possible wavelength range of the beam being tested, a unique identification of the specific mode of the grid cannot be made. The invention avoids this problem, as the joint free spectral range resulting from the use of two etalons can be selected to avoid mode degeneracy. The use of dual photodetectors in prior art wavelength lockers also creates unreliability in wavelength characterization because the operating characteristics of the two photodetectors can vary differently over time due to aging, and the difference signals derived from the detectors for characterization of wavelength will vary correspondingly and become unreliable. The use of a single photodetector in a wavelength reference as provided by the invention overcomes this problem.

Various other arrangements of the wavelength reference apparatus of the invention are possible. The apparatus shown in FIG. 1 and FIG. 3 have etalons positioned in "series", i.e., one after another, within the test beam. In other embodiments of the invention, the multiple etalons may be arranged in "parallel" wherein the test beam is split along separate paths and directed to etalons along the different paths. The light passing through the etalons may then be returned back along the paths by reflectors positioned behind the etalons, combined, and directed to a photodetector. The use of etalons along parallel paths in this manner is disclosed in U.S. patent application Ser. No. 10/099,649, the disclosure of which is incorporated herein by reference.

Figure 3:
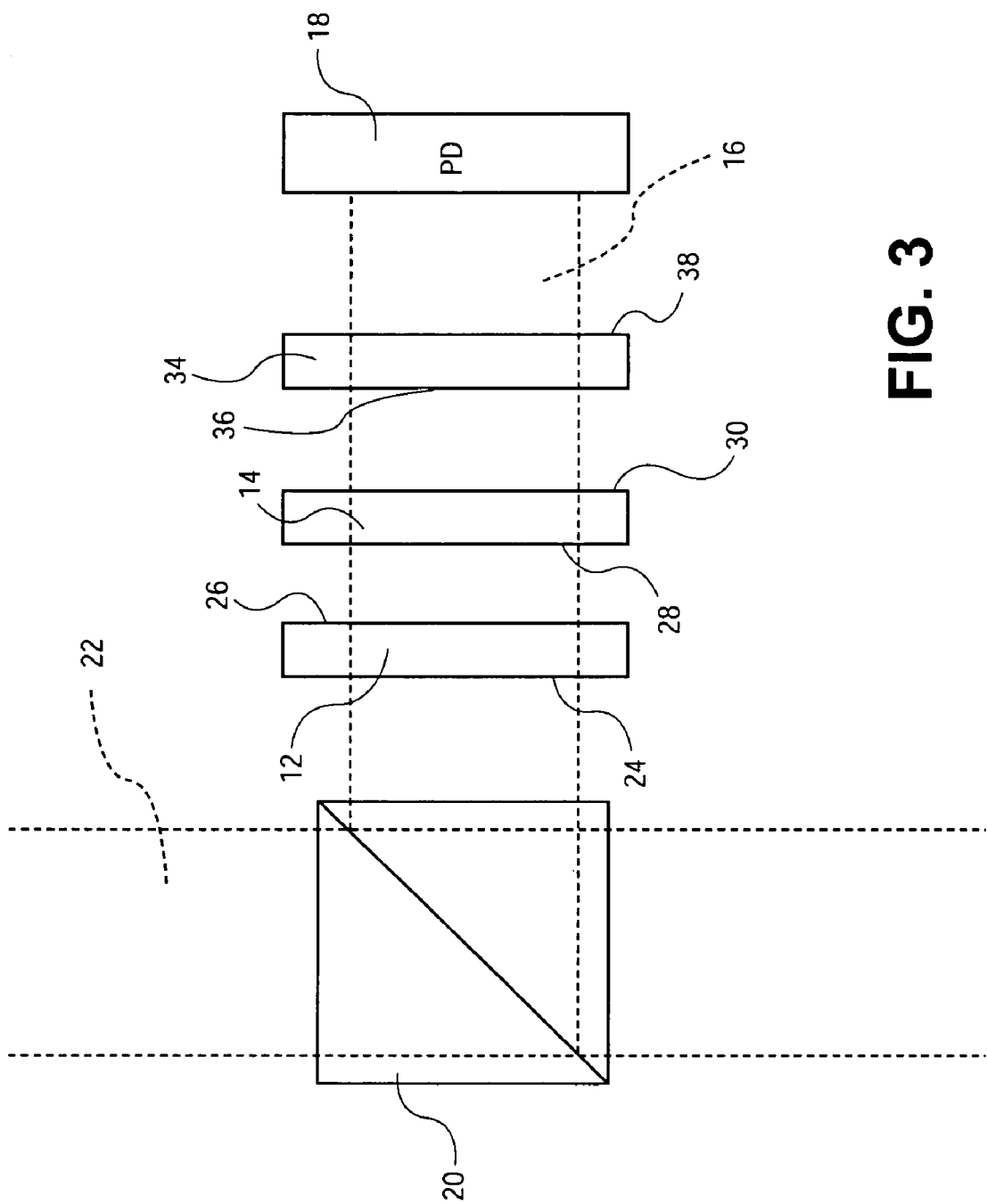
FIG. 3 is an alternative embodiment of a wavelength reference apparatus in accordance with the invention.
Figure 4A:
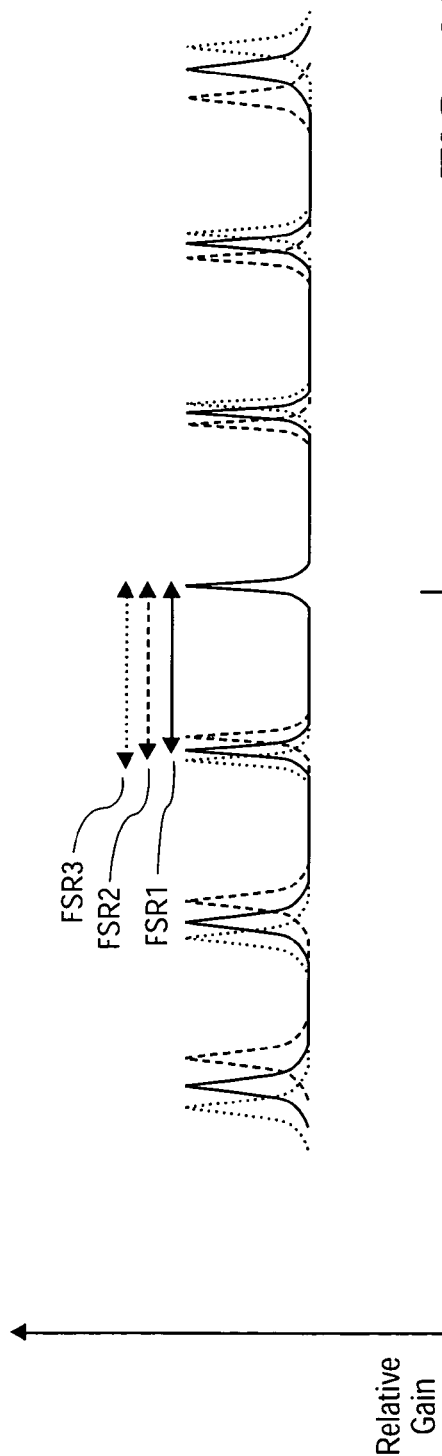
FIG. 4A is a graphical representation of the transmission peaks defined by the etalons of the apparatus of FIG. 3.
Figure 4B:
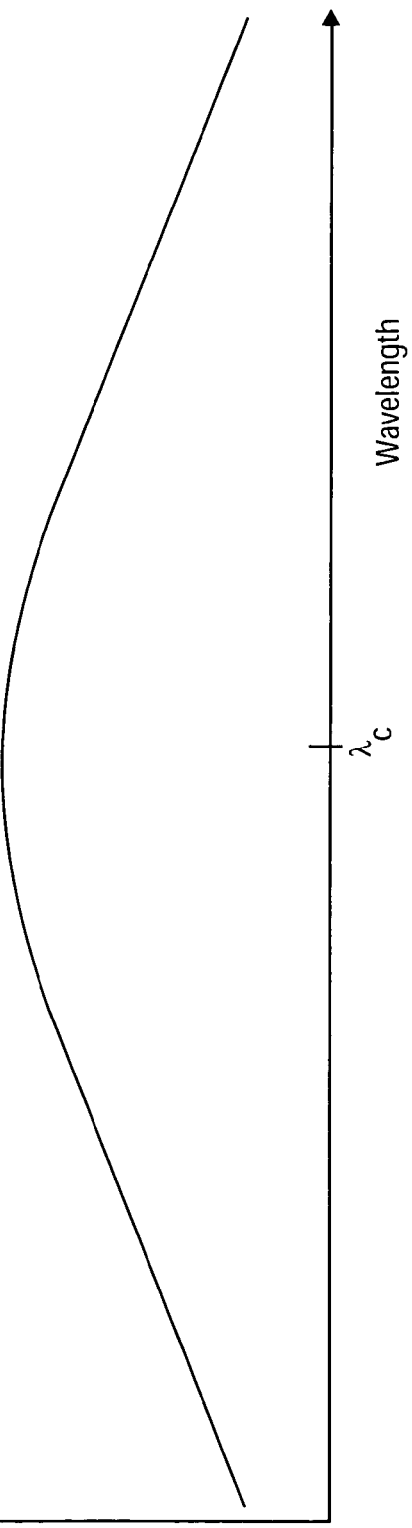
FIG. 4B is a graphical representation of the joint transmission peak resultant from the transmission peaks defined by the etalons of the apparatus of FIG. 3.

Referring now to FIG. 3, another embodiment of a wavelength reference apparatus 32 is shown, with like reference numbers used to denote like parts. The apparatus 32 includes a third etalon 34 with faces 36, 38. Etalon 34 operates as a Fabry-Perot interference filter and has a third free spectral range $FSR_3$ that differs from $FSR_1$ and $FSR_2$. The three etalons 12, 14, 34 each define a plurality of transmission peaks that are shown respectively in FIG. 4A as transmission peaks $P_1$ (shown as solid line) separated by $FSR_1$, transmission peaks $P_2$ (shown as dashed line) separated by $FSR_2$, and transmission peaks $P_3$ (shown as dotted line) separated by $FSR_3$. The three etalons 12, 14, 34 operate to define joint transmission peaks $P_j$ as shown in FIG. 4B. The joint free spectral range or $FSR_j$ that separates transmission peaks $P_j$ as provided by the three etalon apparatus 32, is greater than that provided by the dual etalon apparatus 10 described above. The apparatus 32 thus is usable as a unique wavelength reference generator over larger wavelength ranges than the apparatus 10.

The use of three etalons 12, 14, 16, it should be noted, will generally result in a more complex power transmission function, such that side peaks or modes (not shown) will be associated with the joint transmission peak $P_j$ of FIG. 4B. Such side modes however have substantially lower transmission maxima than the center wavelength of joint transmission peak $P_j$, and the three etalon apparatus 34 thus still provides a unique wavelength reference corresponding to wavelength $_c$ at the transmission maximum of peak $P_j$.

Figure 5:
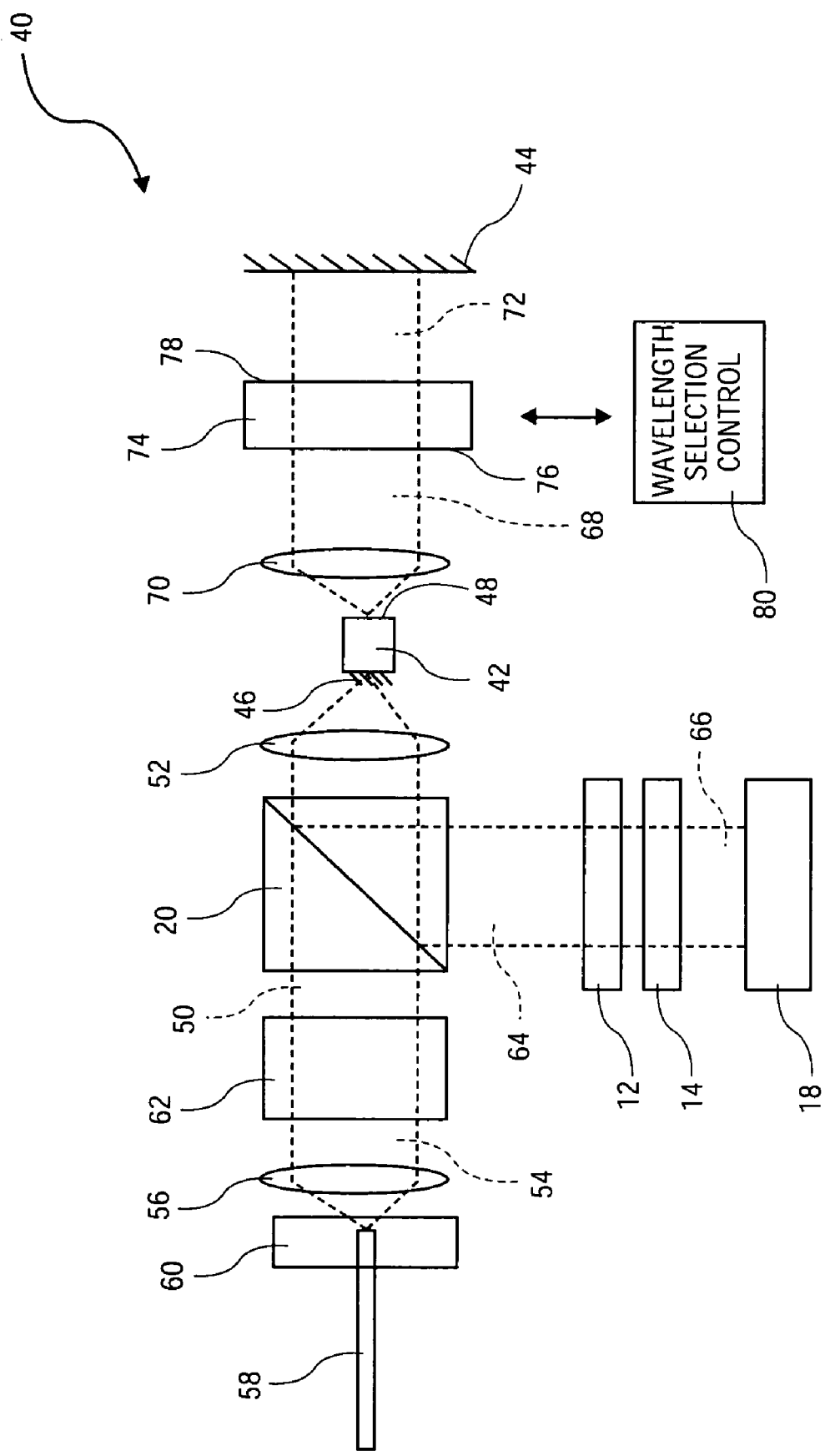
FIG. 5 is an external cavity laser apparatus in accordance with the invention.

Referring now to FIG. 5, there is shown an external cavity laser apparatus 40 in accordance with the invention, wherein like reference numbers are used to denote like parts. The apparatus 40 includes a gain medium 42 and an end or external reflective element 44. Gain medium 42 may comprise a conventional Fabry-Perot diode emitter chip and has a partially reflective first or front facet 46 and an anti-reflection-coated second or rear facet 48. Reflective element 44 may comprise a mirror, prism, grating or other reflective or retroreflective element. An external laser cavity is defined by rear facet 46 and reflective element 44. Gain medium 42 emits an output beam 50 from front facet 16 that is collimated by lens 52 to define an optical path 54. Output beam 50 is focused by lens 56 into an optical fiber 58 that is mounted in a ferrule 60. An optical isolator 62 may be positioned in path 54 to prevent spurious light from fiber 58 from returning along path 54 to gain medium 42.

A beam splitter 20 is positioned in optical path 54 and splits off a portion of output beam 50 to form a test beam 64 that is directed along test beam path 66. First and second etalons 12, 14 are positioned in test beam 64, and a detector 18 is positioned in test beam 64 after etalons 12, 14 to monitor the power level of test beam 64 as transmitted through etalons 12, 14. Etalons 12, 14 provide a wavelength reference as described above according to the transmission maximum of the joint transmission peak defined by etalons 12, 14.

Gain medium also emits a light beam 68 from facet 48, which is collimated by lens 70 along optical path 72 towards reflector 44, which is positioned in path 72. A wavelength selection element 74 is included in the laser apparatus 10 and is shown positioned in optical path 72 between gain medium 42 and end reflector 44. Wavelength selection element 74 may comprise one or more etalons, gratings, prisms or other element or elements that are capable of providing feedback to gain medium 42 along path 72 at a selected wavelength. In the embodiment of FIG. 5, wavelength selection element 74 is shown as an etalon with faces 76, 78 and operates as a Fabry-Perot interference filter. Wavelength selection element 74 is configured to have a free spectral range such that the interference between faces 76, 78 results in a single transmission peak within a wavelength range of interest such as, for example, the gain bandwidth of gain medium 42, the wavelength range of the ITU (International Telecommunications Union) "C"-band (approximately 1525 nanometers to approximately 1565 nanometers), or other wavelength range.

The single transmission peak provided by wavelength selection element 74 allows feedback of light at the transmission peak wavelength, while suppressing potential feedback at other wavelengths which may arise due to modes associated with the external cavity defined by gain medium facet 46 and end reflector 48, transmission maxima associated with a grid generator etalon (not shown) that may be present within the external cavity, or other wavelength at which feedback is not desired. The finesse of wavelength selection element 68 may be configured as needed to provide for effective suppression of feedback within the external cavity at wavelengths other than the single transmission peak defined by wavelength selection element.

A wavelength selection controller 80 is operatively coupled to wavelength selection control element 74, and provides control signals thereto for adjustment or selection of the wavelength of the transmission peak defined by wavelength selection element, and hence the wavelength of light that is fed back to gain medium 42. Wavelength selection element 68 may be tunable by various mechanisms, including thermo-optic, electro-optic, acousto-optic, and piezo-optic tuning, mechanical angle tuning, strain-based tuning, other tuning mechanism or combination of tuning mechanisms, in order adjust the wavelength of the light that is returned to gain medium 42 along path 72. The use of mechanically tuned tapered interference filters and wedge-shaped etalons, transmissive and reflective gratings, and electro-optically tuned etalons for wavelength selection is described, for example, in U.S. patent application Ser. No. 09/814,464. The use of reflective gratings for wavelength selection is also described in U.S. patent application Ser. No. 10/099,730. The use of thermo-optically tuned etalons and etalons of birefringent material is related in U.S. patent application Ser. No. 10/099,649. The aforementioned disclosures are incorporated herein by reference. In embodiments where a reflective grating is used, end reflector 44 may be positioned in a Litmann-Metcalf arrangement to return a selected diffraction back to the gain medium 42, or, in a Littrow arrangement, end reflector 44 may be omitted, as the grating is positioned to return a selected diffraction directly to the gain medium 42. Other types of wavelength selection elements and tuning mechanisms therefore may suggest themselves to those skilled in the art and are considered to be within the scope of this disclosure.

In operation of the laser apparatus 40, current is applied to gain medium 42 in a conventional manner. The beam 68 emitted from facet 48 of gain medium 42 travels path 72 and passes through or otherwise interacts with wavelength selection element 68. Light at the selected wavelength is returned along path 72 to gain medium 42 to provide for lasing at the selected wavelength. The output beam 50 from facet 46 is directed along output path 54 and focused by lens 56 into fiber 58 for use elsewhere. Beam splitter 20 picks off a portion of the output beam as test beam 64, which is directed along optical path 66 through etalons 12, 14 to detector. Etalons 12, 14 define a unique wavelength reference at the transmission maximum of a joint transmission peak as described above. The transmission maximum of the joint transmission peak of etalons 12, 14 corresponds to or is the same as the transmission maximum of the transmission peak defined by the wavelength selection element 74. When photodetector 18 detects a maximum power level, the transmission maximum defined by wavelength selection element 74 (and hence the wavelength of the feedback to gain medium 42 from wavelength selection element 74) corresponds to or is the same as the reference wavelength provided by the joint transmission peak defined by etalons 12, 14.

Figure 6:
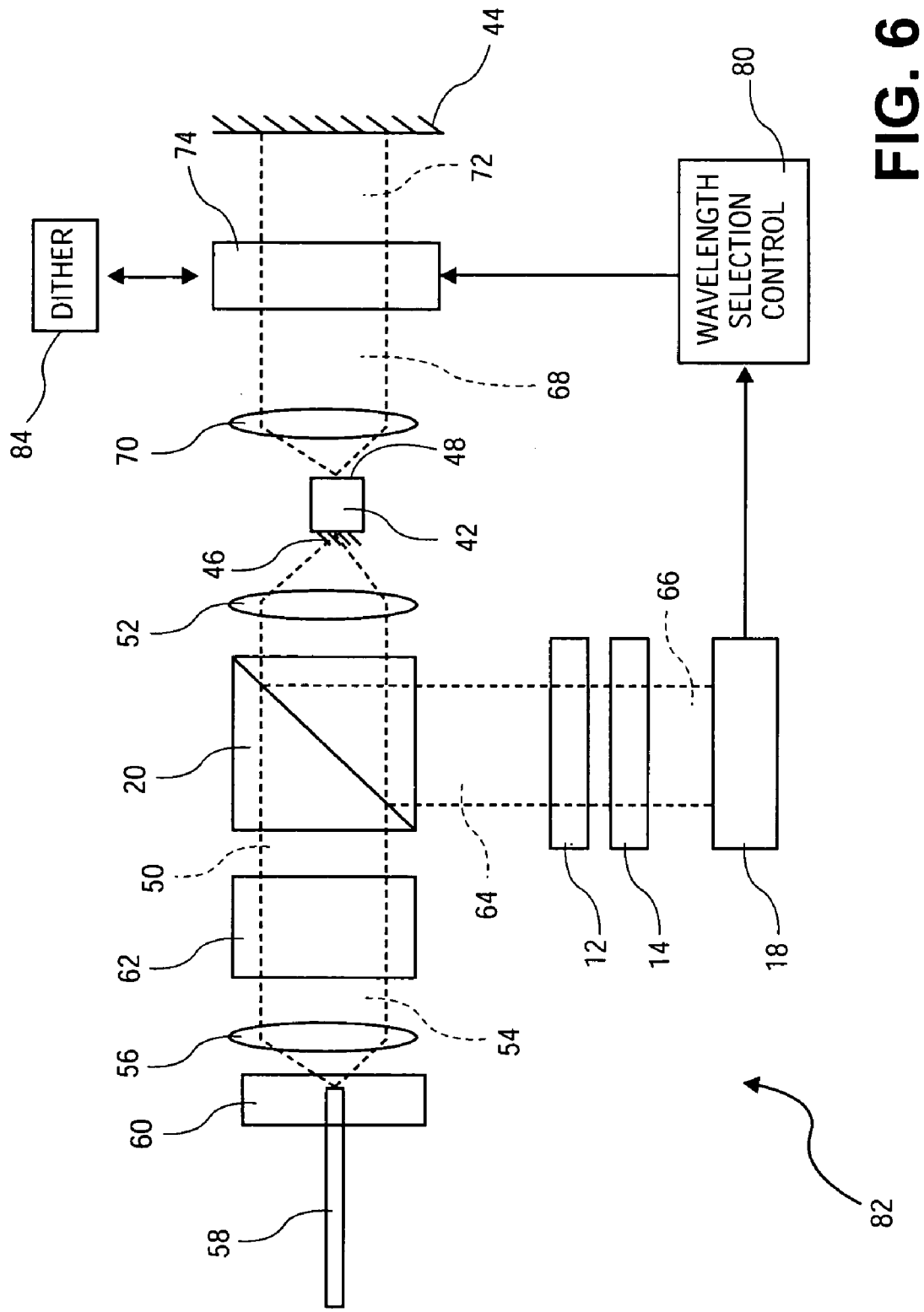
FIG. 6 is another embodiment of an external cavity laser apparatus in accordance with the invention.

Referring now to FIG. 6, there is shown another laser apparatus in accordance with the invention, with like reference numbers denoting like parts. In the apparatus 82, the wavelength selection controller 80 is operatively coupled to photodetector 18 and wavelength selection element 74 to provide a servo system for wavelength control of laser output beam 50. Photodetector 18 continuously, or periodically, monitors the power level of test beam 64, and communicates the measured output power to controller 80. If a drop in output power is observed by detector 18, indicating that wavelength selection element is not properly tuned to the reference wavelength defined by etalons 12, 14, controller 80 may accordingly make adjustments to wavelength selection element 74 in order to tune or adjust wavelength selection element 74 so that feedback to gain medium 42 by wavelength selection element 74 occurs at the reference wavelength.

The laser apparatus 82 may include a dither element 84 configured to introduce a frequency modulation into the transmission peak defined by wavelength selection element 74. The presence of a known frequency modulation provides a good mechanism for developing error signals indicative of deviation of laser output wavelength from the reference wavelength provided by etalons 12, 14. Dither element 84 may comprise a mechanical, piezoelectric, acoustic, thermal, or other type of device that is capable of introducing a periodic modulation or dither in the free spectral range of wavelength selection device. Such a dither may be introduced as a modulation of etalon refractive index, modulation of the spacing between faces 76, 78 of wavelength selection element 74, or both. For example, where wavelength selection element 74 comprises an etalon of electro-optic material, dither element 84 may comprise a voltage source, and frequency modulation may be introduced into the electro-optic material according to voltage modulation applied across the etalon by electrodes. The electro optic material may comprise, for example, lithium niobate or other electro-optic material that is transparent to beam 72.

Dither element 84 may alternatively comprise a mechanical, piezoelectric or acoustic device that introduces a frequency dither in wavelength selection element 74 by mechanical vibration. In still other embodiments, wavelength selection element 74 may comprise an etalon of thermo-optic material, and dither element 84 may comprise a thermal modulator capable of introducing a thermal modulation in the refractive index of the etalon material. Other mechanisms for introducing a modulation to wavelength selection element 84 will suggest themselves to those skilled in art and may also be used with the invention. The modulation introduced by dither element 84 may comprise, for example, a frequency modulation of between about 50 Hz and about 20 KHz. The use of an electro-optic dither element in an external cavity laser and related control systems therefore is described in U.S. patent application Ser. Nos. 09/900,426 and 09/900,443, incorporated herein by reference.

Modulation of wavelength selection element 74 via frequency dither introduced by element 84 produces variations, at a known frequency, in the output power of laser apparatus 82. This modulation is detectable in the monitored optical power by detector 18. The variation in detected output power will decrease in magnitude as the transmission maximum defined by wavelength selection element 74 becomes aligned with the reference wavelength defined by etalons 12, 14, and will increase with decreasing alignment. Additionally, the phase of the synchronous power variation undergoes a distinct change (nominally 180 degrees) as the reference wavelength and transmission maximum cross. In other words, power level variations and phase error in the modulation signal introduced by dither element 84 to wavelength selection element 74 are minimal or nominally zero when the transmission maximum defined by wavelength selection element 74 matches or is otherwise optimally aligned with the wavelength reference peak defined by etalons 12, 14. FIG. 7B graphically illustrates the alignment of the joint transmission peak $P_j$ (dashed line) defined by etalons 12, 14, with the transmission peak $P_{ws}$ (solid line) defined by wavelength selection element 74, with $\lambda_c$ being the reference wavelength as described above. FIG. 7A graphically illustrates a situation in which the wavelength selection element transmission peak $P_{ws}$ and joint transmission peak $P_j$ are misaligned, with the wavelength selection element transmission peak $P_{ws}$ being shifted to a shorter wavelength than the joint transmission peak $P_j$. FIG. 7C graphically illustrates peak misalignment wherein wavelength selection element transmission peak $P_{ws}$ is shifted to a longer wavelength than the joint transmission peak $P_j$.

Figure 8:
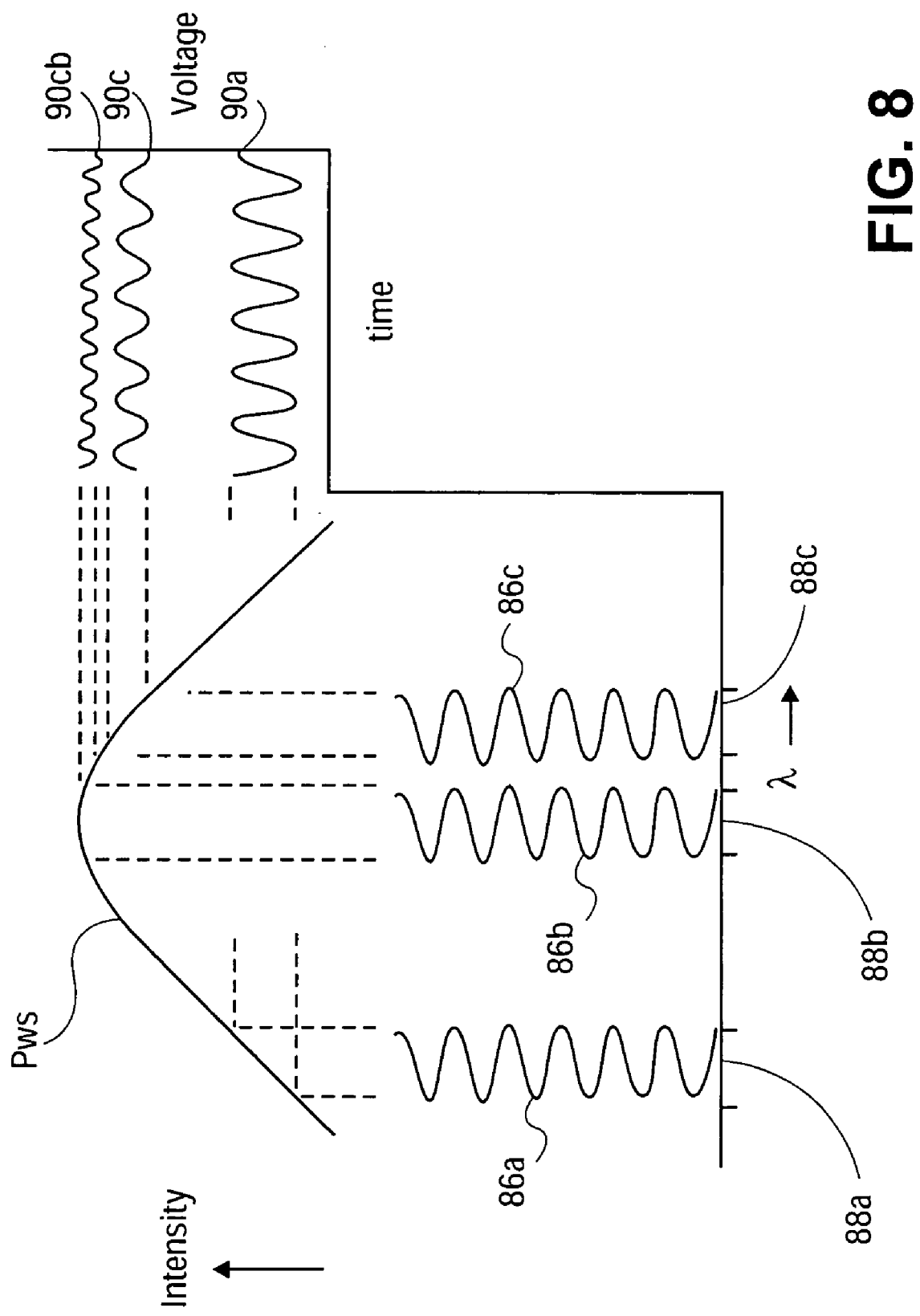
FIG. 8 is a graphical representation of the generation of error signals from a joint transmission peak using the laser apparatus of FIG. 6.

Referring also to FIG. 8, the relationship of the dither modulation signal introduced to wavelength selection element 74 with respect to detected optical power by detector 18 is illustrated graphically as wavelength versus relative intensity or power. FIG. 8 shows the transmission peak $P_{ws}$ of wavelength selection element 74, together with frequency or dither modulation signals 86a, 86b, 86c which correspond respectively to the alignment relationship of FIGS. 7A, 7B and 7C. These alignment relationships are shown in FIG. 8, for reason of clarity as alignment relationships 88a, 88b and 88c respectively. Frequency modulation signals 86a–c are introduced to the wavelength selection element 74 by dither element 84 in the manner described above. In alignment relationship 88a, wavelength selection element transmission peak $P_{ws}$ is off center from joint transmission peak $P_j$ and shifted to shorter wavelength as noted above. Alignment relationship 88b corresponds to the situation wherein wavelength selection element 74 is optimally tuned to the reference wavelength $\lambda_c$ defined by joint transmission peak $P_j$, and alignment relationship 88c corresponds to misalignment of peaks $P_{ws}$ and $P_j$ with $P_{ws}$ shifted to longer wavelength. Peak alignment relationships 88a and 88c represent non-optimal adjustment of wavelength selection element 74, for which adjustment is required. For illustrative purposes, peak alignment relationship 88a is shown as being further off center than alignment relationship 88c.

The optical power detected by photodetector 18 results in a voltage output signal, and the voltage output signals from photodetector 18 for alignment relationships 88a, 88b, 88c are shown respectively as voltage modulation signals 90a, 90b and 90c on the right side of FIG. 8. The location of wavelength selection element transmission peak $P_{ws}$ at a wavelength shorter than that of the center wavelength of joint transmission peak $P_j$ results in voltage signal 80a having a modulation that is in phase with the dither modulation signal 88a. The location of wavelength selection element transmission peak $P_{ws}$ at a greater wavelength than the center wavelength of joint transmission peak $P_j$ results in a modulation of voltage signal 90c that is out of phase with respect to the modulation of dither signal 86c.

The alignment relationships 88a–88c of wavelength selection element transmission peak $P_{ws}$ and joint transmission peak $P_j$ affects the amplitude of the corresponding voltage signal 90a–c, with a greater degree or level of mis-alignment of peaks $P_{ws}$ and $P_j$ resulting in greater amplitude in the signal modulation. Voltage signal 90a, which corresponds to alignment relationship 88a (greater peak misalignment), has a relatively large modulation amplitude, while voltage signal 90c, which corresponds to alignment 88c (lesser peak misalignment), has a correspondingly smaller modulation amplitude. Voltage signal 80b, which corresponds to centering of peaks $P_{ws}$ and $P_{ws}$ has a minimal modulation amplitude since the period of the dither modulation signal 76B occurs symmetrically about the center wavelength of peak $P_{ws}$. The frequency of the dominant intensity in the case of voltage signal 90b in this instance is twice the frequency of dither modulation signal 86b.

From FIG. 8 it can be seen that the amplitude of the modulation introduced to wavelength selection element and detected by detector 18 indicates the magnitude of correction or adjustment required for wavelength selection element 74, while the phase of the voltage signal modulation indicates the direction of the adjustment. The amplitude of dither modulation signals 86a–c is selected so that, when peaks $P_{ws}$ and $P_j$ are aligned, the variation in the intensity of voltage signal modulation is held to acceptable levels. The frequency of the dither modulation is chosen to be high enough to provide coherence control, but low enough to prevent interference with information modulated onto the carrier signal provided by the external cavity laser during transmission. A dither frequency of between about 5 Hz and about 20 KHz is effective for the wavelength tuning over wavelength ranges presently achievable by tunable lasers.

Figure 9:
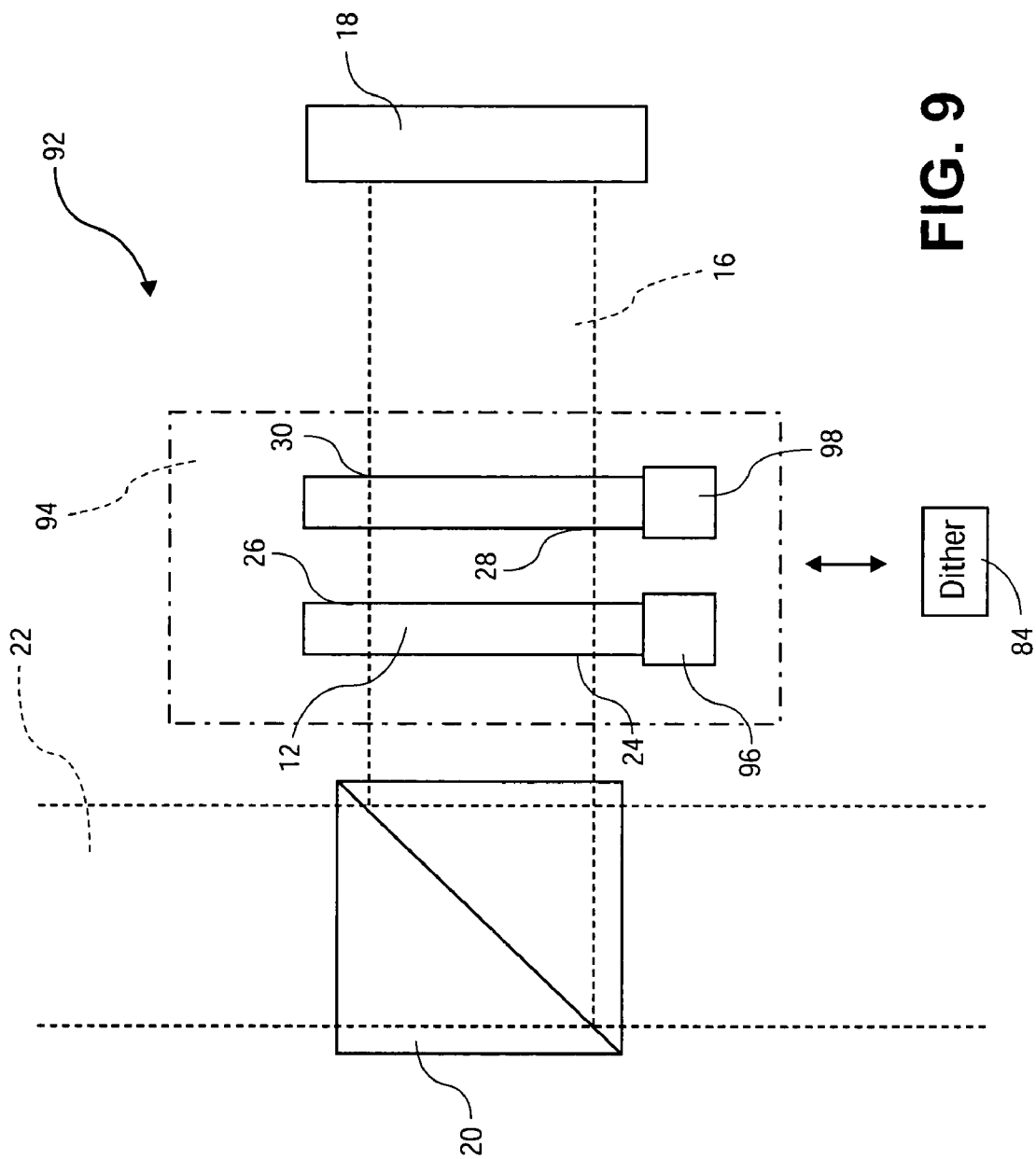
FIG. 9 is another embodiment of a wavelength reference apparatus in accordance with the invention.

In other embodiments of the invention, a frequency modulation or dither may be introduced to one or both of wavelength reference elements 12, 14 to provide the same effect described above wherein modulation is introduced to wavelength selection element 74. Referring to FIG. 9, there is shown another embodiment of a wavelength reference apparatus 92, where like reference numbers denote like parts. In the apparatus 92, wavelength reference elements 12, 14 are shown collectively as a wavelength reference 94 to which a dither element 84 is operatively coupled. Dither element 84 provides a frequency modulation to the joint transmission peak defined by wavelength reference elements 12, 14, which is usable in the manner described above for generation of error signals for active control of laser wavelength. The dither may be introduced as a modulation in refractive index or optical thickness of one or both wavelength reference elements 12, 14 by mechanical, electro-optic, piezo-optic, thermo-optic, or other mechanism as noted above.

In still other embodiments of the invention, wavelength reference elements 12, 14 may be tunable or adjustable as noted above, so that the joint transmission peak $P_j$ defined by wavelength reference elements 12, 14, and hence the reference wavelength $\lambda_c$ at the center of peak $P_j$, can be selectively controlled. In this regard, tuning elements 96, 98 are shown operatively coupled to wavelength reference elements 12, 14 respectively, and may be used to adjust the free spectral range of one or both of elements 12, 14 in order to alter the reference wavelength $\lambda_c$ at the transmission maximum of joint transmission peak $P_j$. Wavelength reference elements may comprise etalons, gratings, prisms in various combinations as noted above, and may be tunable by thermo-optic, electro-optic, acousto-optic, and piezo-optic tuning, mechanical angle tuning, strain-based tuning, other tuning mechanisms as noted above, in generally the same manner described above for wavelength selection element 74. As shown in FIG. 9, wavelength reference elements 12, 14 are in the form of etalons that may comprise a thermo-optic material such as silicon or other semiconductor material, and tuning elements may comprise thermo electric control elements which adjust etalon free spectral range via temperature induced change in etalon material refractive index and/or temperature induced change in etalon thickness. The thermal tuning of silicon etalons to adjust a joint transmission peak defined by the etalons is described in U.S. patent application Ser. No. 10/099,649, noted above.

Figure 10:
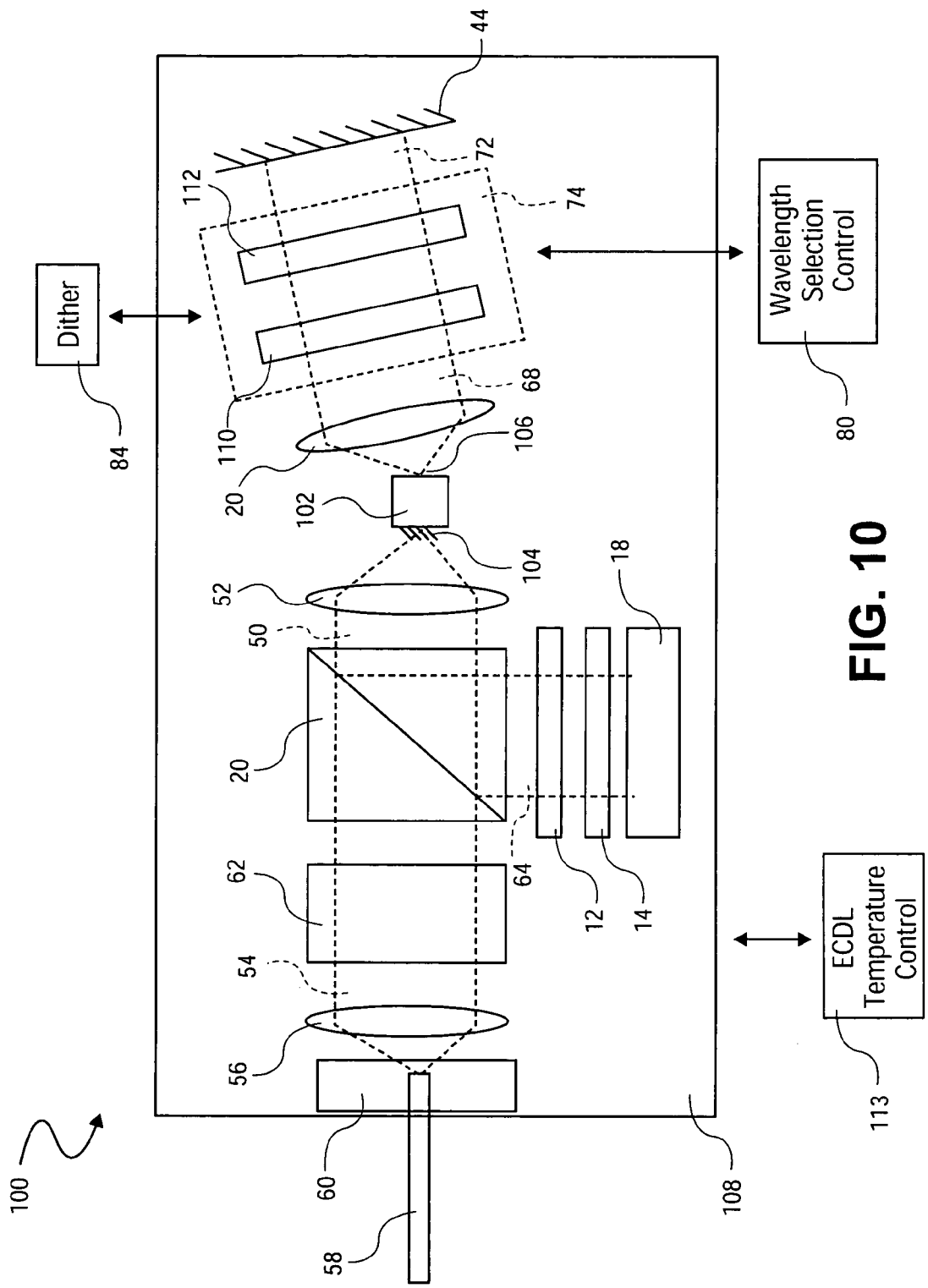
FIG. 10 is another embodiment of an external cavity laser apparatus in accordance with the invention.

Referring now to FIG. 10, there is shown still another embodiment of a laser apparatus 100 in accordance with the invention, with like reference number used to denote like parts. In the apparatus 100, a bent waveguide gain medium 102 is utilized, with non-parallel facets 104, 106 respectively emitting light beams 50, 68. Beam 68 is collimated by lens 70 along path 72 to wavelength selection element 74 and end reflector 44 as noted above, and beam 50 is collimated by lens 52 along path 54 through optical isolator 62, and then focused in to fiber 58 by lens 56. Beam splitter 20 picks off a test beam 64 along path 66 through etalons 12, 14 to detector 18. The external laser cavity of the apparatus 100 is delineated by end reflector 44 and facet 104 of gain medium 102. Bent waveguide gain medium 102 helps prevent unwanted return of direct reflectances of beam 68 off surfaces associated with wavelength selection element 74 or other components such as a grid etalon (not shown) from returning to gain medium 102.

In the embodiment of FIG. 10, a single platform or base 108 supports gain medium 102 and end reflector 44, as well as lenses 52, 56, 70, beam splitter 20, isolator 62 etalons 12, 14, photodetector 18, and other components of the apparatus 100. Use of a common platform to support the optical components of the apparatus 100 imparts vibration stability to the apparatus 100 and facilitate assembly and alignment of the gain medium 102, lenses 52, 56, 70, beam splitter 20, isolator 62 and end reflector 44, etalons 12, 14 and detector 18. The use of a common platform in this manner for the components of an external cavity laser is also described in the U.S. patent application Ser. No. 10/173,571 entitled "MICRO OPTICAL BENCH FOR MOUNTING PRECISION ALIGNED OPTICS, OPTICAL ASSEMBLY AND METHOD OF MOUNTING OPTICS" to inventors Khiem Do et al., simultaneously co-filed herewith, the disclosure of which is incorporated herein by reference. Wavelength selection element 74 is shown in this embodiment as a pair of thermo-optically tunable etalons 110, 112. The use of thermo-optically tuned etalons for wavelength selection is described in U.S. patent application Ser. No. 10/099,649, noted above.

External cavity tuning may be used in the apparatus 100 to provide fine tuning of a selected wavelength via optimizing the relationship of external cavity modes with the transmission peak of wavelength selection element 74. The external cavity modes may be adjusted by physical adjustment of the spacing between facet 104 and end reflector 44, and/or by adjusting the refractive index of material present in the external cavity. Semiconductor gain media materials such as InGaAs and InGaAsP have generally high refractive indices and thus provide an important component of the overall external cavity optical path length. Gain media materials also exhibit relatively large changes in refractive index with respect to temperature, and gain medium refractive index adjustment can be effectively carried out by temperature control of gain medium 102.

Platform 108 comprises a thermally conductive material such as aluminum nitride, to allow common thermal control of the various components of the apparatus 100. Gain medium 102 is thermally coupled to a thermoelectric controller (not shown) via thermally conductive platform 108. Gain medium 102 can thus be temperature adjusted, by heating or cooling introduced from the thermoelectric controller, to adjust gain medium refractive index, and hence external cavity optical path length. A temperature control element 113 may be operatively coupled to thermoelectric controller to provide control signals thereto for selective temperature adjustment of gain medium 102 for external cavity optical path length adjustment. A thermistor or other temperature sensor (not shown) may be included on platform 108 and operatively coupled to control element 113, to monitor the temperature of platform 108, so that if a deviation from a selected temperature is sensed by the thermistor, appropriate corrective temperature adjustment may be made by control element 113.

Both gain medium 102 and end reflector 44 are mounted on platform 108, and the material of platform may be selected to provide a coefficient of thermal expansion such that heating and cooling of platform 108 provides a corresponding expansion and contraction of platform 108 to adjust the physical separation of gain medium facet 104 and end reflector 44, and hence provide adjustment of the external cavity optical path length. The adjustment of the spacing of gain medium facet 102 and end reflector 44 in this manner may be carried out together or simultaneously with the thermal adjustment of gain medium refractive index as described above. Alternatively, gain medium 102 may be thermally isolated from platform 108 such that thermal adjustment of external cavity optical path length is carried out by spacing of gain medium facet 102 and end reflector 44 alone. The use of temperature control of external cavity optical path length is also described in the U.S. Patent Application Ser. No. 09/494,615 entitled "EXTERNAL CAVITY LASER APPARATUS AND METHODS" to inventors Andrew Daiber et al., simultaneously co-filed herewith, the disclosure of which is incorporated herein by reference.

Figure 11:
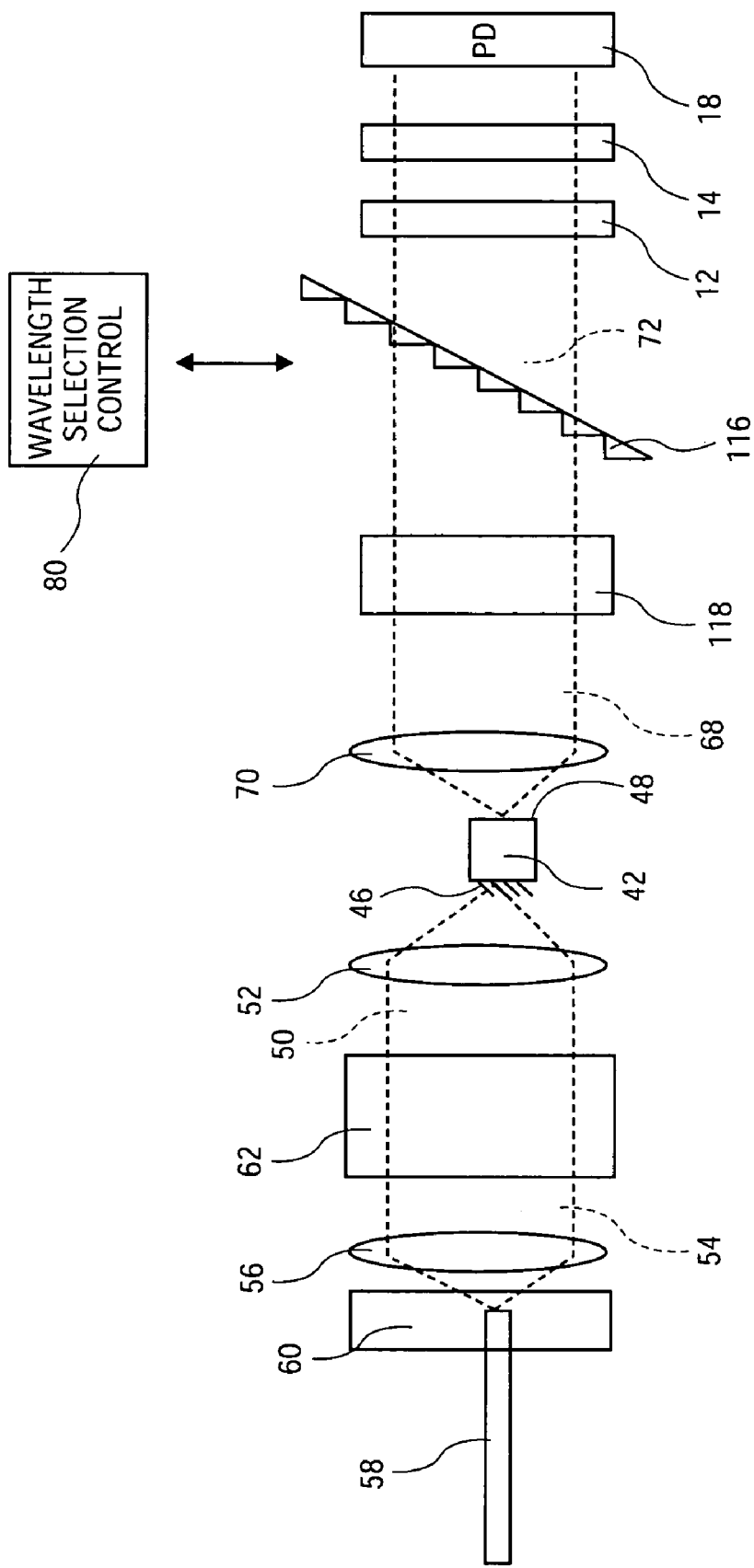
FIG. 11 is another embodiment of an external cavity laser apparatus in accordance with the invention.

Referring now to FIG. 11, yet another embodiment of a laser apparatus 114 in accordance with the invention is shown, wherein like reference numbers denote like parts. In the apparatus 114, wavelength selection is provided in the form of a reflective grating 116, which is shown in FIG. 11 in a Littrow configuration. Grating is angle-tuned via mechanical actuation by wavelength selection controller 80 to selectively feedback light at a single wavelength to gain medium 42 as a selected diffraction from grating 116. The use of a MEMS (microelectromechanical system) actuator to drive a grating in an external cavity laser is also described in U.S. patent application Ser. No. 10/099,730, incorporated herein by reference. In other embodiments, an end reflector may be included with grating 116 and arranged in a Littman-Metcalf configuration with a "folded" external laser cavity. Grating 116 is partially transmissive, and a portion of beam 68 is allowed to pass through grating 118 to wavelength reference elements 12, 14 and detector 18, for use as a wavelength reference in accordance with the invention.

The apparatus 114 also includes a grid etalon 118, which operates as a Fabry-Perot interference filter to define a plurality of transmission peaks that correspond to selectable channel wavelengths to which grating 116 may be tuned by controller 80. The use of a grid etalon to define a plurality of transmission channels is also described in U.S. patent application Ser. No. 09/814,464, noted above.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A wavelength reference apparatus, comprising:
   (a) a first wavelength reference element positioned to receive a portion of a light beam emitted from a gain medium, said first wavelength reference element having a first free spectral range and having a plurality of first transmission peaks within a gain bandwidth of said gain medium;
   (b) a second wavelength reference element positioned to receive said portion of said light beam, said second wavelength reference element having a second free spectral range different from said first free spectral range and having a plurality of second transmission peaks within said gain bandwidth, said first and second wavelength reference elements configured to define a joint free spectral range and only one joint transmission peak within said gain bandwidth; and (c) a detector positioned to receive said portion of said light beam after said first and second wavelength reference elements.

2. The apparatus of claim 1, further comprising said gain medium to emit said light beam.

3. The apparatus of claim 1, further comprising a beam splitter positioned to direct said portion of said light beam to said first and second wavelength reference elements.

4. The apparatus of claim 2, wherein said joint free spectral range is greater than or equal to said gain bandwidth of said gain medium.

5. The apparatus of claim 2, wherein said gain medium comprises first and second facets, and said light beam comprises a first light beam emitted from said first facet.

6. The apparatus of claim 5, further comprising a wavelength selection element positioned to receive a second light beam emitted from said second facet of said gain medium, said wavelength selection element configured to feed back light of a selected wavelength to said gain medium.

7. The apparatus of claim 6, further comprising a reflective element positioned to receive and to reflect said second light beam after said wavelength selection element, said reflective element and said first facet of said gain medium defining an external laser cavity.

8. The apparatus of claim 1, wherein said first and second wavelength reference elements comprise at least one etalon.

9. The apparatus of claim 1, wherein at least one of said first and second wavelength reference elements is tunable.

10. The apparatus of claim 1, further comprising a dither element operatively coupled to at least one of said wavelength reference elements, said dither element configured to introduce a frequency modulation to said joint transmission peak.

11. A laser apparatus, comprising:
(a) a gain medium having a first facet to emit a first light beam;
(b) a first wavelength reference element positioned in association with said first light beam having a first free spectral range and having a plurality of first transmission peaks within a wavelength range of interest;
(c) a second wavelength reference element positioned in association with said first light beam having a second free spectral range and having a plurality of second transmission peaks within said wavelength range of interest, said second free spectral range different from said first free spectral range, said first and second wavelength reference elements configured to define a single joint transmission peak within said wavelength range of interest; and
(d) a detector positioned in association with said first light beam after said first and second wavelength reference elements.

12. The apparatus of claim 11, wherein said gain medium includes a second facet to emit a second light beam.

13. The apparatus of claim 12, further comprising a wavelength selection element positioned to receive said second light beam and configured to feed back light of a selected wavelength to said gain medium.

14. The apparatus of claim 11, further comprising a beam splitter positioned to split said first light beam, said beam splitter configured to pick off a test light beam from said first light beam, said first and second wavelength reference elements positioned to receive said test light beam.

15. The apparatus of claim 13, wherein said wavelength selection element is tunable.

16. The apparatus of claim 15, further comprising a wavelength selection controller operatively coupled to said detector and said wavelength selection element and said detector, said wavelength selection controller operable to adjust said selected wavelength according to optical power detected by said detector.

17. The apparatus of claim 16, further comprising a dither element operatively coupled to said wavelength selection element and configured to introduce a frequency modulation to said wavelength selection element.

18. The apparatus of claim 13, wherein said wavelength selection element comprises at least one etalon.

19. The apparatus of claim 13, wherein said wavelength selection element comprises a grating.

20. The apparatus of claim 12, wherein said gain medium comprises a bent wave guide gain medium.

21. A method of operation, comprising:
(a) directing a portion of a light beam emitted by a gain medium through first and second wavelength reference elements;
(b) generating a first plurality of transmission peaks within a gain bandwidth of said gain medium with said first wavelength reference element;
(c) generating a second plurality of transmission peaks within said gain bandwidth with said second wavelength reference element;
(d) generating only one joint transmission peak within said gain bandwidth by aligning one of said first plurality of transmission peaks with one of said second plurality of transmission peaks; and
(b) measuring optical power of said portion of said light beam after directing said portion of said light beam through said first and second wavelength selection elements.

22. The method of claim 21, further comprising feeding back said light beam to said gain medium with a selected wavelength through a third wavelength selection element.

23. The method of claim 22, further comprising introducing a frequency modulation into said light beam via said third wavelength selection element.

24. The method of claim 23, further comprising generating an error signal from measuring said optical power.

25. The method of claim 24, further comprising adjusting said selected wavelength in response to said error signal.

* * * * *